United States Patent [19]
Nam

[11] Patent Number: 5,477,070
[45] Date of Patent: Dec. 19, 1995

[54] DRIVE TRANSISTOR FOR CCD-TYPE IMAGE SENSOR

[75] Inventor: Jung-hyun Nam, Kyungki-do, Rep. of Korea

[73] Assignee: Samsung Electronics Co., Ltd., Kyungki-do, Rep. of Korea

[21] Appl. No.: 227,352

[22] Filed: Apr. 13, 1994

[30] Foreign Application Priority Data

Apr. 13, 1993 [KR] Rep. of Korea ............... 1993-6155

[51] Int. Cl.[6] .............. H01L 29/796; H01L 29/78; G11C 19/28
[52] U.S. Cl. .............. 257/239; 257/344; 257/408; 377/60
[58] Field of Search ............... 257/239, 344, 257/408; 377/60

[56] References Cited

U.S. PATENT DOCUMENTS

| | | |
|---|---|---|
| 3,745,425 | 7/1973 | Beale et al. ............... 257/344 |
| 4,389,615 | 6/1983 | French et al. ............. 257/239 |
| 4,660,064 | 4/1987 | Hamasak .................. 257/239 |
| 4,680,603 | 7/1987 | Wei et al. ................. 257/344 |
| 5,029,190 | 7/1991 | Narabu et al. ............. 257/239 |
| 5,132,758 | 7/1992 | Minami et al. ............. 257/344 |
| 5,192,990 | 3/1993 | Stevens ..................... 257/408 |
| 5,349,225 | 9/1994 | Redwine et al. .......... 257/344 |
| 5,357,129 | 10/1994 | Kamimura ............... 257/239 |

*Primary Examiner*—Gene M. Munson
*Attorney, Agent, or Firm*—Stephen R. Whitt; Charles R. Donohoe

[57] ABSTRACT

A charge-coupled device type image sensor having a floating diffusion-type amplifier including a drive transistor comprising a substrate, a drain region, a source region, a depletion channel region formed between the drain and source regions in contact with the drain region, and a gate electrode formed on the substrate between the source region and the drain region, such that the gate electrode overlays a portion of the source region and overlays a portion of the depletion channel region, wherein the drain region is spaced apart from said gate electrode.

6 Claims, 4 Drawing Sheets

DRIVE TRANSISTOR FOR CCD-TYPE IMAGE SENSOR

BACKGROUND OF THE INVENTION

The present invention relates to a charge-coupled device (CCD) type image sensor, and more particularly, to an MOS output circuit section of a CCD image sensor employing a floating diffusion-type amplifier within a signal detection section.

A CCD has a very simple structure comprised of a plurality of MOS transistors formed in a regular array on the surface of a semiconductor substrate. Each MOS transistor in the array assumes one of two states on the basis of a voltage applied to its gate. The first state, a non-balanced state, is characterized by deep depletion layer extending through a portion of a surface of the semiconductor substrate. The second state, a balanced state, is characterized by an accumulation of minority carriers. Digital logic states of "0" or "1" can be respectively defined as corresponding to each of these two states. In this manner, the CCD can be used as a digital memory device, or as a signal processing device adapted to process digital signals. Additionally, the voltage signal applied to the respective MOS transistor gates may be continuously varied between the non-balanced and balanced states in which case the CCD may function as an analog device. Functioning in either its analog or digital modes, the CCD may be adapted for use as an image sensor.

A typical image sensor operates by collecting or distributing electrical charge on the basis of photoelectric energy incident to light received by the sensor. In other words, the image sensor operates by photoelectrically converting an optical signal into an electrical signal. In a CCD type image sensor, electrical charge is accumulated in response to an optical signal. The accumulated charge is then sequentially transferred through and output from the CCD by a pulse clocking signal. The charge is transferred as an output signal via an output section to external circuitry which realizes an image corresponding to the received light.

A floating diffusion-type amplifier (FDA) is commonly used within the output section of a CCD type image sensor. An FDA is used to handle the output charge which may be produced at a relatively high level. Furthermore, an FDA introduces very little noise into the output signal.

FIG. 1 is a schematic plan view illustrating an output section of a CCD having a conventional FDA. The output section shown in FIG. 1 is exemplary of the type of circuit disclosed in U.S. Pat. No. 4,660,064 to Hamasaki et al, and is characterized by a floating diffusion region and a precharge diffusion region which are aligned so as to increase the output gain.

Within FIG. 1, output gate electrode 17 is formed on one end of a CCD transfer section 1. A precharge MOS transistor (or reset MOS transistor) is comprised of a floating diffusion region 18, a precharge gate 25, and a precharge drain 23. A first drive MOS transistor M1 is comprised of a source region 20, a drain region 21, and a gate electrode 19 connected to floating diffusion region 18 which is bordered by a channel stopper region 22. Naturally a plurality of such structures is formed in an array, but for purposes of this explanation only a single structure is described in FIG. 1.

FIG. 2 is a diagram showing an equivalent circuit for the output section of a CCD having a conventional FDA. As shown in FIG. 2, electrical charge flows from the output terminal of CCD transfer section 1 to diode 2 in the floating diffusion region, and is converted to a voltage signal by output amplifier 3. It is this voltage signal produced by output amplifier 3 which is detected as an output signal. Output amplifier 3 is a charge sensing circuit including first drive transistor M1 of FIG. 1. The charge sensing circuit generally uses a source follower having a voltage gain close to unity. Reference numeral 4 denotes a precharge transistor.

FIG. 3 is a cross-sectional view taken along line III—III of FIG. 1. In FIG. 3, a P-type semiconductor layer 12 is formed over a N-type semiconductor substrate 11. A plurality of N-type regions 13 are formed in an array in the surface of semiconductor layer 12. An insulating layer 14, for example, a silicon oxide film, is deposited on the plurality of N-type region 13, and a plurality of transfer electrodes 15 are connected to form CCD transfer section 1 of FIG. 2.

Clock pulse signals $\phi 1$ and $\phi 2$ of alternating phases are provided as a driving pulse signal to selected N-type regions 13. Transfer electrodes 15, output gate electrode 17, and $N^+$ type floating diffusion region 18 are formed in one end of CCD transfer section 1. Floating diffusion region 18 is connected to a gate electrode 19 of first drive MOS transistor M1 which constitutes a portion output amplifier 3.

In addition, a precharge drain region 23 is formed in the surface of semiconductor layer 12, such that a channel region 24 is apparent between floating diffusion region 18 and precharge drain region 23. Insulating layer 14 is deposited on the upper portion of a channel region 24 so as to form a precharge gate electrode 25. Thus, a precharge transistor having floating diffusion region 18 as a source region is formed.

The transfer and detection of electrical charge, as an output signal, will be described with reference to FIGS. 1 and 2. Initially, clock pulses $\phi 1$ and $\phi 2$ are applied to respective transfer electrodes 15 as shown in FIG. 3. In response to clock pulses $\phi 1$ and $\phi 2$, electrical charge is sequentially transferred from N-type regions 13 via a transfer channel formed in the surface of semiconductor substrate 11. Output gate 17 further transfers the electrical charge to floating diffusion region 18.

Floating diffusion region 18 is connected to output amplifier 3 which acts as a charge sensing or detecting circuit. Output amplifier 3 includes first drive MOS transistor M1, having gate electrode 19 connected to floating diffusion region 18 in order to sense the voltage level (i.e., electrical charge) of floating diffusion region 18. In addition to accumulating transferred charge, floating diffusion region 18 acts a source region for precharge transistor 4. Finally, drain region 23 of the precharge transistor is fixed by a predetermined voltage potential $V_{PD}$.

A series of reset voltage pulses $V_{PG}$ are applied to precharge gate electrode 25 from an external reset pulse generator, and a precharge transistor is periodically turned ON so as to reset floating diffusion region 18 to voltage potential $V_{PD}$ supplied by precharge drain electrode 23. Accordingly, the electrical potential of floating diffusion region 18 is always "set" to $V_{PD}$, as defined in precharge region 23, whenever precharge transistor 4 is turned ON. However, when precharge transistor 4 remains OFF electrical isolation between drain region 23 and floating diffusion region 18 is maintained until electrical signal charge is again accumulated in floating diffusion region 18.

As mentioned above, output amplifier 3 connected to floating diffusion region 18 detects a voltage change within this region, wherein the detected voltage is directly proportional to the amount of electrical charge accumulated in floating diffusion region 18, and is inversely proportional to the capacitance of the floating diffusion region 18. Any detected change in voltage is convened to a coherent image information signal by subsequent, well-known signal process circuitry.

A voltage change $\Delta V_{OUT}$ in output amplifier 3 can be expressed as follows.

$$\Delta V_{OUT} = \frac{Q_{SIG}}{C_{FD}}$$

where $Q_{SIG}$ is an amount of charge transferred to floating diffusion region 18, and $C_{FD}$ is the sum of capacitances associated with floating diffusion region 18, including parasitic capacitances.

Referring to FIG. 2 and the above equation, $C_{FD}=C_B+C_P+C_O+C_I+C_{IN}$, where $C_B$ is equal to the sum of the capacitance between floating diffusion region 18 and P-type semiconductor well 12, and the capacitance between floating diffusion region 18 and channel stopper region 22, $C_P$ is equal to the sum of capacitance C1 between floating diffusion region 18 and precharge gate electrode 25 and capacitance C2 between the precharge gate electrode 25 and the gate electrode 19 of first drive MOS transistor M1, $C_O$ is equal to the capacitance between floating diffusion region 18 and output gate 17, $C_I$ is equal to the capacitance between the adjacent wires in output amplifier 3, and $C_{IN}$ is equal to the input capacitance of output amplifier 3. Output voltage detection sensitivity for output amplifier 3 is determined by capacitance $C_{FD}$ and by the voltage gain $A_V$ of output amplifier 3. That is, detection sensitivity is the ratio of $A_V$ to $C_{FD}$, and is expressed in terms of coulomb per volts.

Typical image sensors having the foregoing structure and operation have become increasingly integrated in recent years. While increased integration has several benefits including reduced size and power consumption, increased integration also proportionally reduces the light incident, pixel area of the image sensor. Accordingly, an amount of electrical charge $Q_{SIG}$ transferred to the floating diffusion region is decreased since the overall photoelectric conversion region is reduced by increased integration.

In order to effectively detect voltage variations associated with the accumulation of reduced electrical charge in contemporary image sensors, an voltage detection sensitivity must be improved. In order to dramatically improve detection sensitivity, the capacitance associated with floating diffusion region 18 must be significantly reduced. Specifically, input capacitance $C_{IN}$, which accounts for a considerable portion of capacitance $C_{FD}$, must be significantly reduced.

FIG. 4 is another cross-sectional view of FIG. 1 taken along line IV—IV, which illustrates a charge sensing circuit, i.e., first drive MOS transistor M1 of output amplifier 3 within the CCD image sensor having a conventional FDA. As shown in FIG. 4, gate electrode 19 partially overlaps each one of opposing gate source region 20 and drain region 21. This structure results in first drive MOS transistor M1 having a parasitic capacitance $C_m$ between overlapping gate electrode 19 and source region 20, and another parasitic capacitance $C_d$ between overlapping gate electrode 19 and drain region 21. $C_m$ and $C_d$ significantly increase input capacitance $C_{IN}$ of output amplifier 3. Parasitic capacitance $C_m$ can be compensated by the Miller effect according to the driving operation of first drive MOS transistor M1. This is not the case for parasitic capacitance $C_d$. Thus, $C_{in}$ of output amplifier 3 is increased by $C_d$, and a detection sensitivity of a signal detecting section incorporating output amplifier 3 is proportionally degraded.

SUMMARY OF THE INVENTION

The present invention provides a CCD type image sensor having a FDA with improved detection sensitivity. This is accomplished in the present invention by decreasing the parasitic capacitance of a drive MOS transistor within the charge sensing circuit associated with the FDA.

In one aspect the present invention comprises a charge-coupled device type image sensor including a drive transistor comprising; a substrate, a drain region formed in a major surface of the substrate, a source region formed in the major surface of the substrate, a depletion channel region formed in the major surface of the substrate between the drain region and the source region and in contact with the drain region, a gate electrode formed on the substrate between the source region and the drain region such that the gate electrode overlays a portion of the source region and overlays a portion of the depletion channel region, wherein the drain region is spaced apart from the gate electrode.

In another aspect, the present invention comprises a charge-coupled device type image sensor including a drive transistor, wherein the gate electrode comprises a first gate electrode portion and a second gate electrode portion, the first gate electrode portion overlaying the portion of the source region and the second gate electrode portion overlaying the portion of the depletion channel region.

Yet another aspect of the present invention comprises a charge-coupled device type image sensor including a drive transistor comprising; a substrate, a drain region formed in a major surface of the substrate, a source region formed in the major surface of the substrate, a buried drain region formed below the major surface of the substrate in contact with the drain region and between the source region and the drain region, a gate electrode formed on the substrate between the source region and the drain region such that the gate electrode overlays a portion of the source region and overlays a portion of the buried drain region, wherein the drain region is spaced apart from the gate electrode.

BRIEF DESCRIPTION OF THE DRAWINGS

The advantages of the present invention will become more apparent upon consideration of a preferred embodiment with reference to the attached drawings in which.

DETAILED DESCRIPTION OF THE INVENTION

Figure 1:
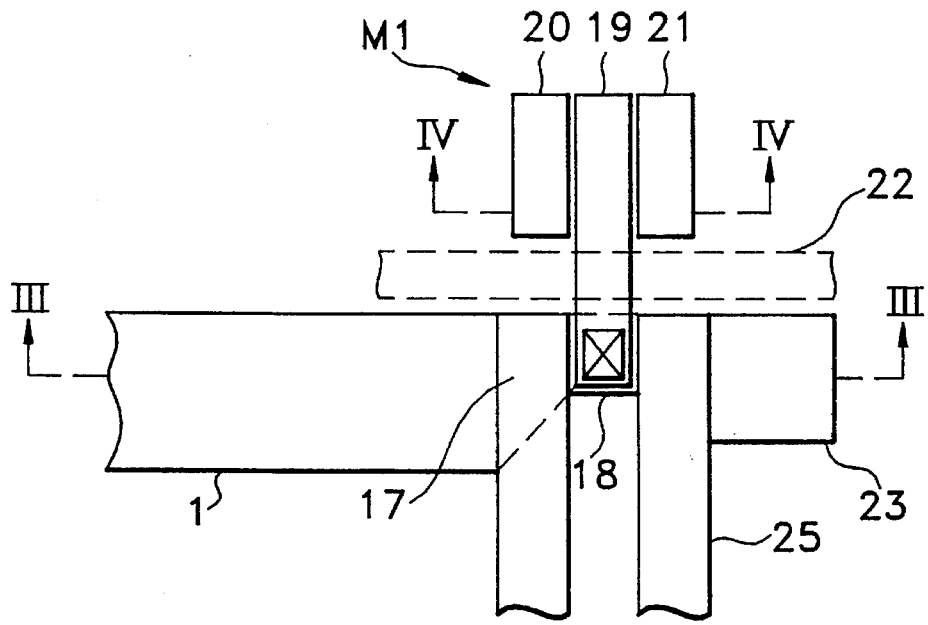
FIG. 1 is a schematic plan view showing an output section of a CCD-type image sensor having a conventional floating diffusion-type amplifier.
Figure 2:
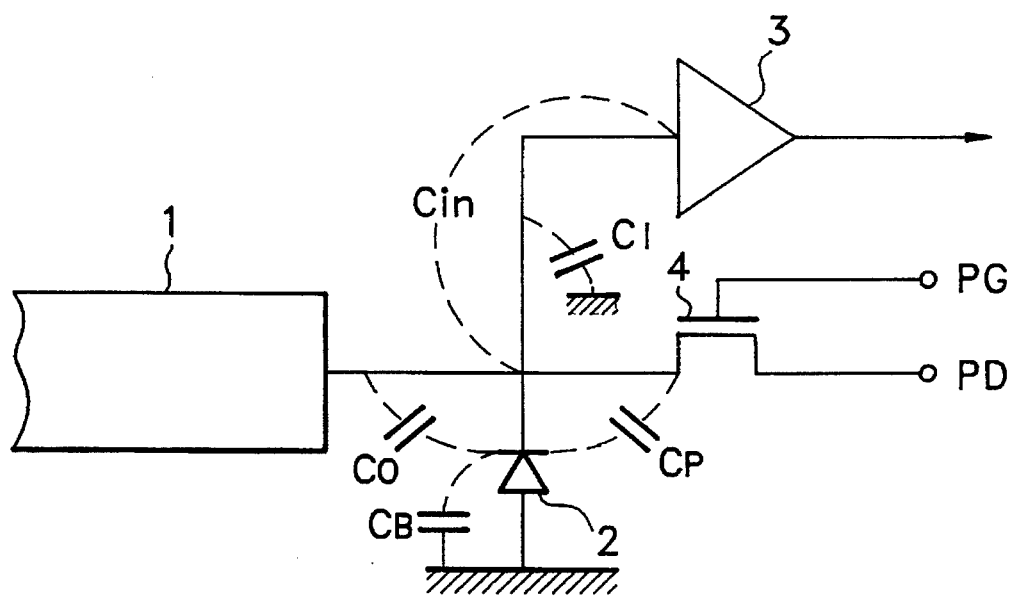
FIG. 2 is a circuit diagram showing an output section of a CCD-type image sensor having a conventional floating diffusion-type amplifier.
Figure 3:
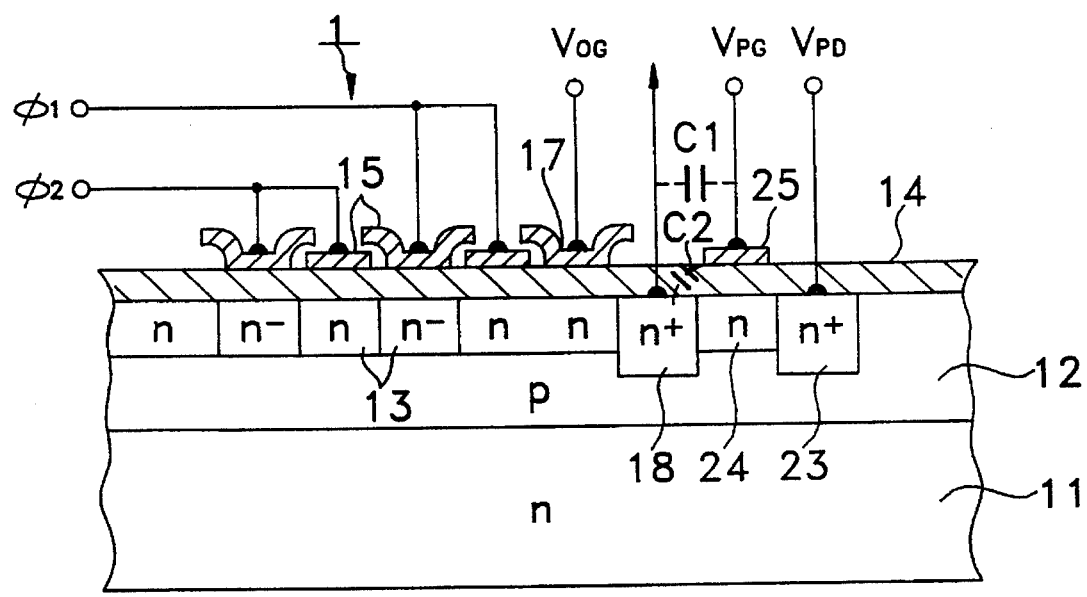
FIG. 3 is a section view taken along line III—III of FIG. 1.
Figure 4:
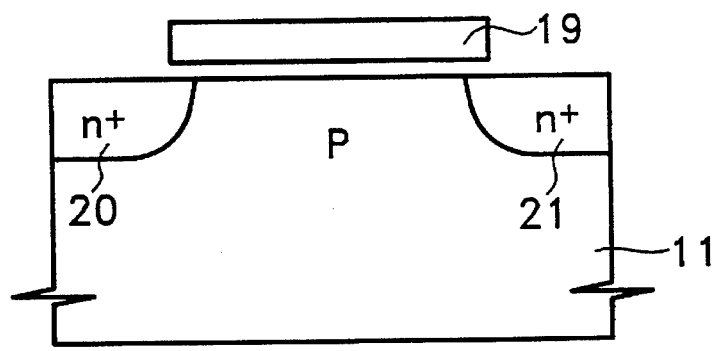
FIG. 4 is a section view taken along line IV—IV of FIG. 1.
Figure 5:
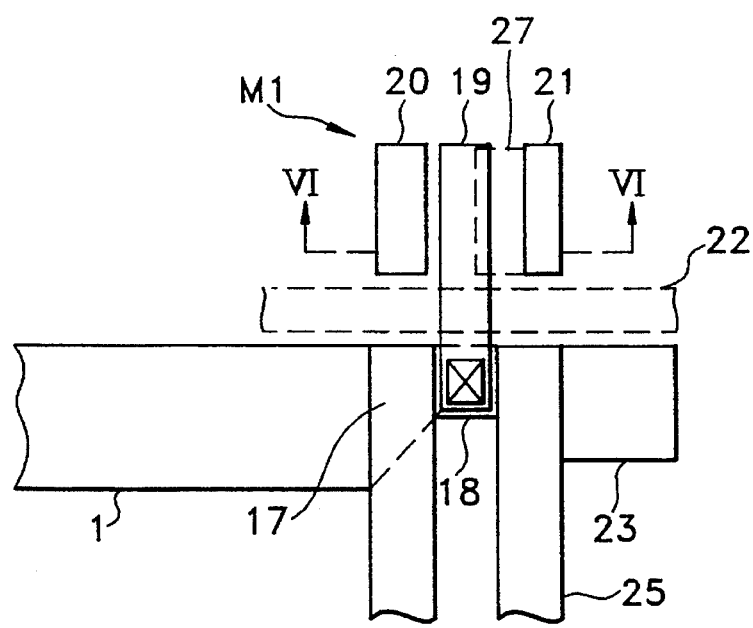
FIG. 5 is a schematic plan view showing an output section of a CCD-type image sensor having a floating diffusion-type amplifier according to the present invention.

FIG. 5 is a schematic plan view showing an output section of a CCD type image sensor having a FDA according to the present invention. Specifically, FIG. 5 shows part of the drive MOS transistor which constitutes a charge sensing circuit in a FDA adapted to an output circuit section of the CCD type image sensor. The charge sensing circuit is shown in its typical arrangement as a source follower having a unity voltage gain $A_V$. Within the subsequently described drawings, like reference numerals denote like elements and features described with respect to previously described FIGS.

Referring to FIG. 5, gate electrode 19 of the drive MOS transistor is connected to floating diffusion region 18. In addition, source region 20 is aligned with the gate electrode 19. Part of source region 20 is overlapped by gate electrode 19. Drain region 21 is formed such that gate electrode 19 does not overlap drain region 21. In addition, a depletion channel 27 is formed between gate electrode 19 and drain region 1, such that it contacts drain region 21 and is partially overlapped by gate electrode 9. Assuming for this particular example, that semiconductor substrate 11 is doped with P-type impurities to form semiconductor layer 12, source region 20 and drain region 21 are doped in high concentration with N-type impurities, while depletion channel 27 is doped with N-type impurities to concentrations lower than that of the source region and the drain region.

In operation, voltages supplied to gate electrode 19 and to drain region 21 in the FDA shown in FIG. 5 are controlled in such a manner that depletion channel 27 can be completely depleted. In other words, the voltage bias of drain region 21 is controlled to be greater than the operational voltage of gate electrode 19. By maintaining this relationship, the parasitic capacitance $C_d$ created between gate electrode 19 and drain region 21 is greatly decreased. This relationship and the resulting benefits can be achieved within the structure shown in FIG. 5 by a MOS drive transistor (charge sensing circuit) configured according to one of several presently preferred embodiments as described below.

Figure 6:
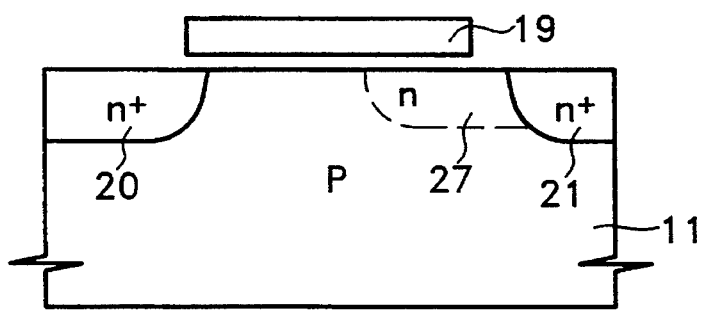
FIG. 6 is a cross-sectional, partial section view taken along line VI—VI in FIG. 5 showing a preferred embodiment of a charge sensing circuit section according to the present invention.

FIG. 6 is a cross-sectional, partial section view taken along line VI—VI of FIG. 5, showing a drive MOS transistor formed accordance with a preferred embodiment of the present invention. Gate electrode 19 is formed on a semiconductor substrate 11, and source region 20 and drain region 21 are also formed in the surface of semiconductor substrate 11 on opposing sides of gate electrode 19. Source region 20 in alignment with gate electrode 19 such that part of source region 20 is overlapped by gate electrode 19. Drain region 21 is formed separated from gate electrode 19 by a predetermined spacing. Depletion channel 27 is formed in the semiconductor substrate under a portion of gate electrode 19 and in contact with drain region 21. In this embodiment, semiconductor substrate 11 is doped with P-type impurities, while source region 20, drain region 21 and depletion channel 27 are doped with N-type impurities. As can be seen from FIG. 6, the depth of depletion channel 27, as formed within the semiconductor substrate, is preferably less than the depth of drain region 21.

Figure 7:
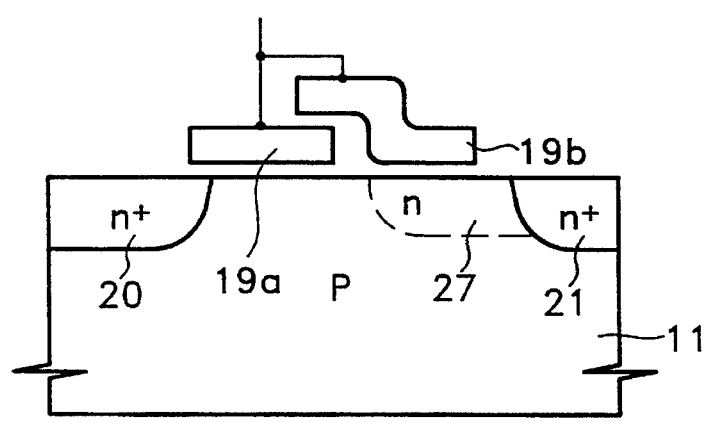
FIG. 7 is a cross-sectional, partial section view taken along line VI—VI in FIG. 5 showing another preferred embodiment of a charge sensing circuit section according to the present invention.

FIG. 7 is a cross-sectional view of another embodiment of a charge sensing circuit section according to the present invention. This second embodiment is characterized by a gate electrode (19) comprising a first gate electrode portion 19a partially extending over source region 20, and a second gate electrode portion 19b. Depletion channel 27 is disposed in contact with drain region 21. Second gate electrode portion 19b is electrically connected to first gate electrode portion 19a, and extends over a portion of depletion channel 27. The first gate electrode portion 19a may be separated from the second gate electrode portion 19b by a insulating layer (not shown).

This structure further enhances the predictability and reliability of a drive transistors which are sensitive to channel length. Second gate electrode 19b while formed over depletion channel 27 avoids overlapping drain region 21. In this embodiment, the voltages applied to first and second gate electrode portions 19a and 19b, as well as the voltages which bias drain region 21 are regulated in such a manner that drain region 21 maintains a higher voltage than that applied to the respective gate electrode portions, thereby greatly decreasing the parasitic capacitance generated between the gate electrode and the drain region.

Figure 8:
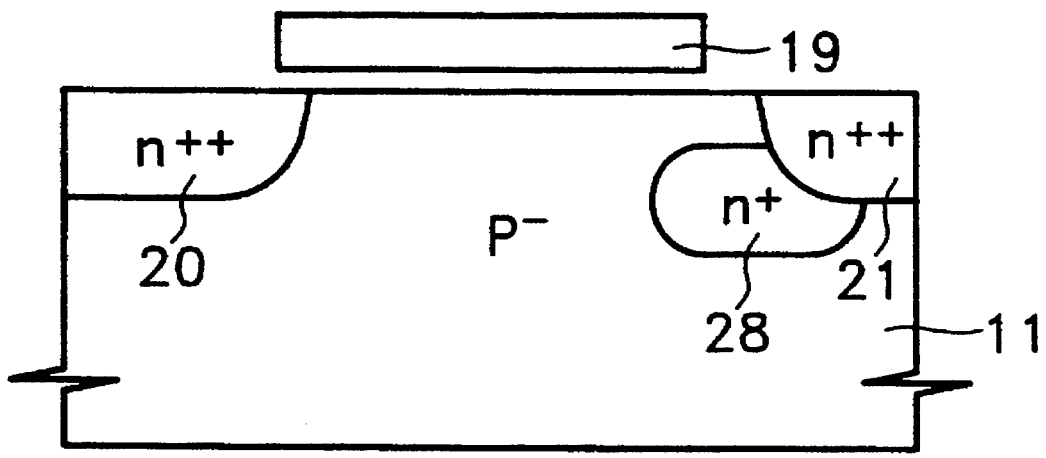
FIG. 8 is a cross-sectional, partial section view taken along line VI—VI in FIG. 5 showing yet another preferred embodiment of a charge sensing circuit section according to the present invention.

FIG. 8 is a cross-sectional view of still another preferred embodiment of a charge sensing circuit according to the present invention. Referring to FIG. 8, source region 20 and drain region 21 are formed in the surface of semiconductor substrate 11. An insulating layer (not shown) is inserted on semiconductor substrate 11 between source region 20 and drain region 21 to thereby form gate electrode 19. In addition, buried drain region 28 partially in contact with drain region 21 is formed at a predetermined depth from the surface of semiconductor substrate 11. Gate electrode 19 and drain region 21 are separated by a predetermined spacing so as to avoid any overlapping.

Buried drain region 28 may be formed by implanting the impurities of a selected conductivity type, opposite that different of semiconductor substrate 11, using well-known high energy ion implantation methods. Since gate electrode 19 operates as an anti-implantation mask during the ion implantation, buried drain region 28 is formed adjacent to gate electrode 19. The shielded portion of semiconductor substrate 11 between the buried drain region 28 and source region 20 essentially retains its initial impurity density. Assuming in the present embodiment that semiconductor substrate 11 is P⁻ type, source region 20 and drain region 21 are (or become after the second ion implantation required to form N⁺ buried drain region 28) N⁺⁺ type.

Accordingly, when the transistor operates, if voltage is applied to the gate electrode and drain region, the channel between the source region and buried drain region 28 is formed at a predetermined depth from the surface of the semiconductor substrate. Additionally, a surface depletion layer caused by the PN-junction is formed in the upper portion of buried drain region 28, to thereby reduce the parasitic capacitance $C_d$ between gate electrode 19 and drain region 21. This third embodiment reduces the parasitic capacitance between the gate electrode and drain region even when the voltage supplied to drain region 21 equals that supplied to gate electrode 19.

Figure 9:
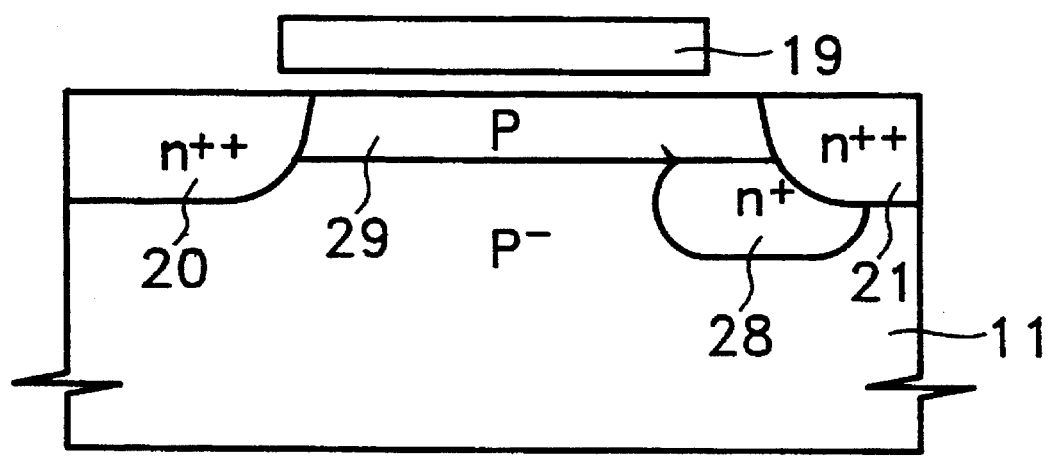
FIG. 9 is a cross-sectional, partial section view taken along line VI—VI in FIG. 5 showing still another preferred embodiment of a charge sensing circuit section according to the present invention.

FIG. 9 is a cross-sectional view of yet another embodiment of a charge sensing circuit according of the present invention. This embodiment is similar to the third embodiment described above, except that a surface depletion layer 29 is formed on the semiconductor substrate 11 by varying the concentration of the substrate impurity. Assuming in the present example that the semiconductor substrate 10 is P$^-$ type, a P type surface depletion layer 29 is formed between source region 20 and drain region 21 over N+ type buried drain region 28.

In each of the above embodiments, the parasitic capacitance between the gate electrode and the drain region of a drive MOS transistor is significantly reduced as compared to the drive MOS transistor in the conventional FDA. Thus, the overall input capacitance of a typical source follower which constitute the charge sensing circuit in the CCD image sensor of the present invention is remarkably reduced, to thus result in an improved charge detection sensitivity. These improvements are apparent in each of the several preferred embodiments described above. Those skilled in the art will recognize that various modifications and routine design changes may be made to the embodiments described above, and that the present invention is not limited to the exemplary embodiments, but is defined by the appended claims.

What is claimed is:

1. A charge-coupled device type image sensor including a drive transistor comprising:
    a substrate of first conductivity type;
    a drain region of second conductivity type formed in a surface of said substrate;
    a source region of second conductivity type formed in said surface of said substrate spaced apart from said drain region;
    a depletion channel region of second conductivity type formed in said surface of said substrate between said drain region and said source region in contact with said drain region;
    a first gate electrode formed over said surface of said substrate between said source region and said drain region and overlaying a portion of said source region; and
    a second gate electrode, physically separate from said first gate electrode and electrically connected to said first electrode, formed over said surface of said substrate between said source region and said drain region and overlaying a portion of said depletion channel region.

2. A charge-coupled device type image sensor according to claim 1, further comprising an insulating layer formed over said first gate electrode;
    wherein said second gate electrode is formed over said insulating layer and overlays a portion of said first gate electrode.

3. A charge-coupled device type image sensor according to claim 1, wherein a first voltage applied to said drain region is greater than a second voltage applied to said first and second gate electrodes.

4. A charge-coupled device type image sensor according to claim 1, wherein an impurity concentration in said depletion channel region is less than that of said drain region.

5. A charge-coupled device type image sensor according to claim 1, wherein said drain region is formed with a first depth and said depletion channel region is formed with a second depth less than said first depth.

6. A charge-coupled device type image sensor including a drive transistor comprising:
    a substrate of first conductivity type;
    a drain region of second conductivity type formed in a surface of said substrate;
    a source region of second conductivity type formed in said surface of said substrate and spaced apart from said drain region;
    a buried drain region of second conductivity type having an impurity density less than the impurity density of said drain region formed below said surface of said substrate between said source region and said drain region in contact with said drain region;
    a surface depletion layer of first conductivity type, having an impurity concentration greater than said substrate, formed in said surface of said substrate between said drain region and said source region overlaying a portion of said buried drain region
    a gate electrode electrically formed over said substrate between said source region and said drain region such that said gate electrode overlays a portion of said source region and overlays a portion of said buried drain region.

* * * * *